United States Patent

Uchiyama et al.

[11] Patent Number: 5,954,929
[45] Date of Patent: Sep. 21, 1999

[54] DEPOSITION-PREVENTING PART FOR PHYSICAL VAPOR DEPOSITION APPARATUSES

[75] Inventors: Naoki Uchiyama; Munenori Mashima; Makoto Kinoshita; Yorishige Hashimoto, all of Sanda, Japan

[73] Assignee: Mitsubishi Materials Corporation, Tokyo, Japan

[21] Appl. No.: 08/738,660

[22] Filed: Oct. 30, 1996

[30] Foreign Application Priority Data

Feb. 15, 1996 [JP] Japan .................................. 8-027584
Mar. 25, 1996 [JP] Japan .................................. 8-068123
Jul. 10, 1996 [JP] Japan .................................. 8-180739

[51] Int. Cl.$^6$ .................................................. C23C 14/00
[52] U.S. Cl. ........................ 204/298.11; 118/720; 118/721
[58] Field of Search ................ 204/298.11; 118/723 VE, 118/723 CB, 723 EB, 720, 721; 430/5

[56] References Cited

FOREIGN PATENT DOCUMENTS 56-59234  5/1981  Japan .
6-29298   2/1994  Japan .

Primary Examiner—Thi Dang
Attorney, Agent, or Firm—Oblon, Spivak, McClelland, Maier & Neustadt, P.C.

[57] ABSTRACT

A deposition-preventing part, particularly a masking tool, which is used over an area to be protected from adhesion of a physical vapor deposition film, for physical vapor deposition apparatuses which are used to form physical vapor deposition films of metals, particularly noble metals, on CD-ROM, CD-R or CD-E substrates. One or more of a solder-plated Cu wire, a solder-plated Cu foil tape, an Al foil tape and a synthetic resin tape are attached, in a peelable manner, on a solder film formed on the surface of the substrate of a deposition-preventing part such as a masking tool, which has a surface roughness of 0.01–1 $\mu$m when expressed as the arithmetic mean roughness defined according to JIS B 0601, a thickness of 5–100 $\mu$m and a melting point of 100–450° C.

36 Claims, 6 Drawing Sheets

DEPOSITION-PREVENTING PART FOR PHYSICAL VAPOR DEPOSITION APPARATUSES

BACKGROUND OF THE INVENTION

1. Field of the Invention

The present invention relates to a deposition-preventing part (e.g., masking tool, shielding ring, shutter, etc.) which is used over an area to be protected from adhesion of a physical vapor deposition film when a physical vapor deposition apparatus is used to form a physical vapor deposition metal film, particularly a physical vapor deposition noble-metal film, as a reflective film on the surface of the substrate of a CD-ROM (read-only compact disc), CD-R (recordable and regenerable compact disc), or CD-E (erasable compact disc) (hereunder collectively referred to as CD), and further to a masking tool for physical vapor deposition apparatuses for noble metals, particularly Au.

2. Description of the Related Art

Figure 1:
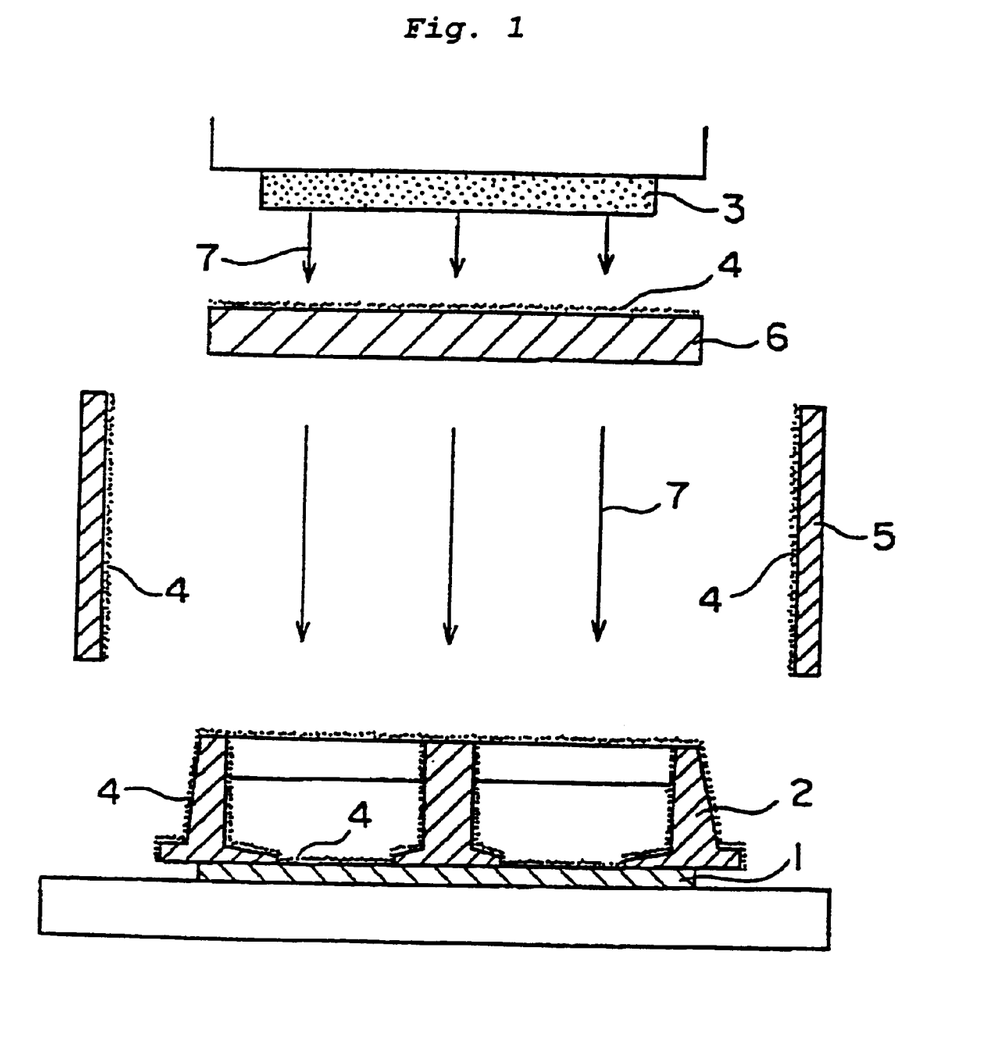
FIG. 1 is a schematic cross-sectional view illustrative of the configuration of a physical vapor deposition apparatus for Au.

Preparation of CDs, such as CD-ROMS, CD-Rs and CD-Es, with physical vapor deposition Au films formed as reflective films on the substrate surfaces has been well known, and physical vapor deposition apparatuses for Au which are used for the preparation are, as illustrated in FIG. 1, each composed of a shielding ring 5 for preventing adhesion of a physical vapor deposition Au film on the inner wall of the vessel (not shown) of the physical vapor deposition apparatus for Au, a shutter 6 for temporarily stopping the flow of active Au metal 7 which is generated from the Au target when a CD prepared with a ring-shaped physical vapor deposition Au film 4 formed on the surface of the CD substrate 1 is replaced by a fresh CD substrate 1.

In order to form the ring-shaped, physical vapor deposition Au film 4 on the surface of the CD substrate 1 using an apparatus of the type mentioned above for physical vapor deposition of Au, as illustrated in FIG. 1, the active Au metal 7 which has been generated from the Au target 3 is deposited by physical vapor deposition on the CD substrate 1 which has a masking tool 2 overlaid thereon and is placed in the shielding ring 5 of the physical vapor deposition apparatus for Au.

Figure 2:
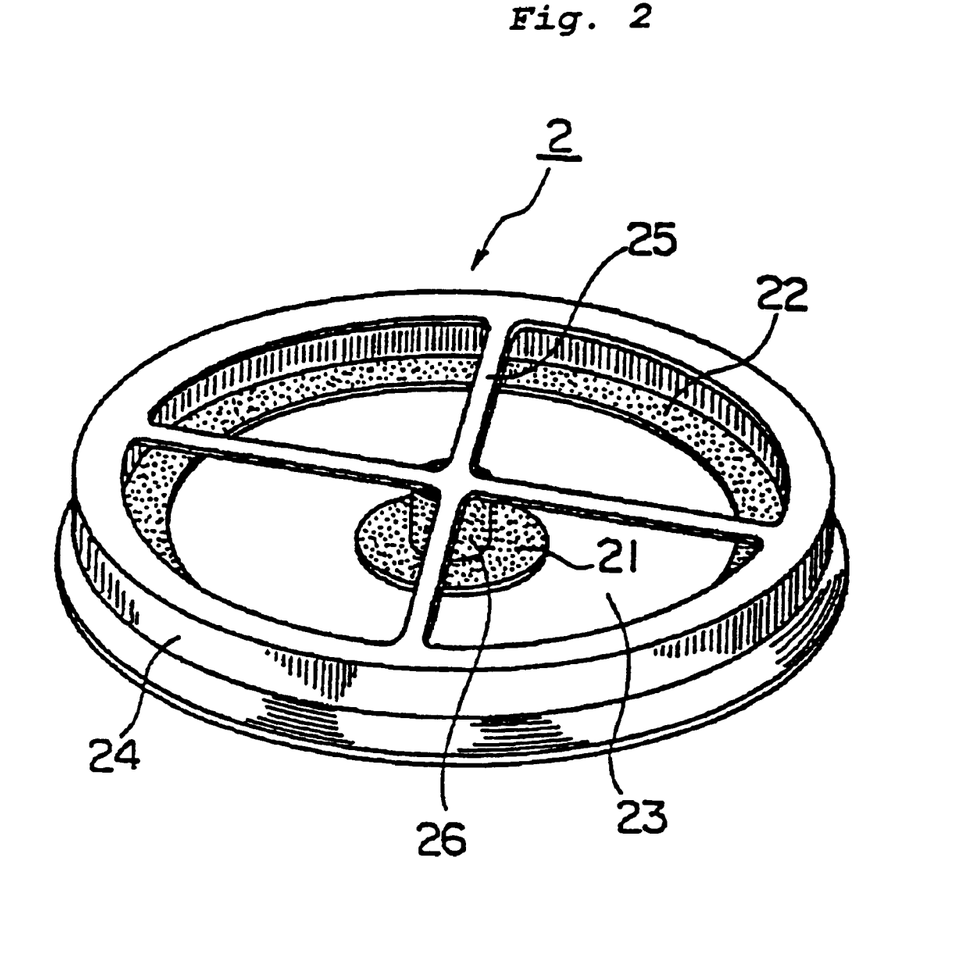
FIG. 2 is a perspective view of a masking tool.

The masking tool 2 which is overlaid on the CD substrate 1 can be prepared with any metallic material, but is mainly made of Cu or a Cu alloy, and as illustrated in the perspective view in FIG. 2, it comprises a disc-shaped center masking shield 21 and a ring-shaped peripheral masking shield 22, with such a configuration that the center masking shield 21 and the peripheral masking shield 22 are attached concentrically and so as to form a ring-like opening 23 between the center masking shield 21 and the peripheral masking shield 22, and the center masking shield 21 is supported, via a support 26, by a supporting arm 25 which extends from a peripheral barrel 24.

When the masking tool 2 constructed in this way is overlaid on the CD substrate 1 and a ring-shaped physical vapor deposition Au film 4 is formed on the surface of the CD substrate 1, the physical vapor deposition Au film 4 naturally adheres to the surface of the overlying masking tool 2 as well. The physical vapor deposition Au film 4 which has adhered to the surface of the masking tool 2 is of course recovered, and known methods for the recovery include a) recovering by mechanical peeling such as sand blasting; b) formation of an aluminum film on the surface of the masking tool and recovering of the physical vapor deposition Au film formed on the aluminum film through dissolution of the aluminum film in an aqueous NaOH solution; c) use of a masking tool with an electroplating layer of a metal of the platinum group (Pt, Rh, Ir, Ru, etc.) formed on the surface and recovering of the Au which has adhered to the surface of the masking tool by physical vapor deposition, using a commercially available gold-removing agent.

After the Au formed by physical vapor deposition has been recovered and removed according to any of the above-mentioned methods, the masking tool is reused. In summary, known masking tools of the prior art include masking tools consisting only of masking tool substrates made of Cu or a Cu alloy, masking tools comprising aluminum films formed on the surfaces of the masking tool substrates made of Cu or a Cu alloy, and masking tools comprising electroplating layers of a metal of the platinum group (Pt, Rh, Ir, Ru, etc.) formed on the surfaces of the masking tool substrates made of Cu or a Cu alloy.

Recovering by mechanical peeling such as sand blasting, however, is not preferred as a method of recycling expensive masking tools over the long term, since masking tools, which must have high dimensional precision and high levels of surface evenness, have extremely shorter working lives due to deformation or reduction in size after repeated recycling. In addition, recovery of Au from powder resulting from processing by sand blasting can be accomplished only with poor efficiency, since many steps are required for the recovery due to inclusion of Cu or a Cu alloy in the powder deriving from the masking tools.

On the other hand, the method of forming an aluminum film on the surface of the masking tool by physical vapor deposition and forming an Au film on the aluminum film by physical vapor deposition, has a drawback in that a fresh aluminum film must be formed each time the masking tool is used after recovery of the physical vapor deposition Au film, the regenerated masking tool must be stored with care since the formed aluminum film tends to change into an alumina coating, and further the Cu base can undergo corrosion due to immersion in an NaOH solution for recovery.

Accordingly, the most often used method is currently the one described in c) above, where a masking tool with an electroplating layer of a metal of the platinum group formed thereon is used, and the masking tool with Au adhering thereto by physical vapor deposition is immersed in an aqueous solution of a commercially available gold-removing agent, KCN and NaOH which is kept at 50° C. or lower, and the Au which has adhered by physical vapor deposition is recovered as a cyanogen complex. However, since electroplating layers of metals of the platinum group have remarkably different plating-layer thicknesses depending on the configurations of the substrates, it has been difficult to obtain uniform electroplating layers of metals of the platinum groups.

For example, one problem has been that when masking tool substrates made of Cu or Cu alloys have pinholes or acute portions in the surfaces, the electroplating layers of metals of the platinum group on such portions become extremely thin, and dissolution and corrosion of the masking tool substrates made of Cu or Cu alloys start at these thin portions of the plating layers, thus reducing the number of times the masking tools can be recycled.

SUMMARY OF THE INVENTION

In view of the prior art described above, the present inventors have researched in order to provide a masking tool from which the physical vapor deposition Au film is more easily recovered than the masking tools of the prior art and which can be recycled many times, with the following findings:

(a) Formation of a solder film on the surface of a masking tool substrate made of Cu or a Cu alloy allows shorter, easier peeling of a possible vapor deposition Au film on the surface of the solder film as a result of shorter, easier removal of the solder film on the surface of the masking tool substrate by immersion of the masking tool with the physical vapor deposition Au film adhering thereto, in a solution of a solder-removing agent, while shaking if necessary;

(b) Here, use of a solder-removing agent which results in less corrosion of Cu and Cu alloys naturally results in less corrosion of the masking tool substrate, and thus the masking tool can be recycled more times than according to conventional methods of recovering the physical vapor deposition Au deposited on the masking tool;

(c) The solder film can be more easily formed than aluminum films and films of metals of the platinum group of the prior art; and (d) When physical vapor deposition of Au is continued for a long time using the above-mentioned masking tool with a solder film formed thereon, the Au sometimes covers the entire surface of the solder film of the masking tool to prevent the solder-removing agent from coming into contact with the solder film, and this results in failure to peel the solder film from the masking tool and thus to recover the noble metal even when the Au-adhering masking tool is immersed in a solution of a solder-removing agent and shaken. Even in such a case, however, when a solder-plated Cu wire or Cu foil tape, an Al foil tape or a synthetic resin tape is attached in a peelable manner, via an adhesive, on the top surface of the solder film formed on the surface of the masking tool substrate made of Cu or a Cu alloy, and the solder-plated Cu wire or Cu foil tape, the AL foil tape or the synthetic resin tape is peeled off after physical vapor deposition of Au, the portion of the solder film on the surface of the masking tool substrate which is in contact with the applied Cu wire, Cu foil tape, AL foil tape or synthetic resin tape, is exposed. Accordingly, when the masking tool with Au adhering thereto by physical vapor deposition, which is provided with the partially exposed solder film, is then immersed in a solution of a solder-removing agent, while shaking if necessary, peeling of the solder film starts at the exposed portion of the solder film, and this results in removal of the solder film on the entire masking tool and eventual shorter, easier peeling of the physical vapor deposition Au film formed on the surface of the solder film.

The copper alloy used in the present invention is not particularly limited, and any copper alloy may be used so long as it performs the intended function. Examples of metals which can be alloyed with copper include one or more of zinc, tin, aluminum, nickel, zirconium and chromium.

DETAILED DESCRIPTION OF THE INVENTION

The present invention, which has been accomplished on the basis of the findings described above, is characterized as:

(1) a masking tool for physical vapor deposition apparatuses for Au, which comprises a solder film formed on the surface of a masking tool substrate, particularly a solder film formed on the surface of a masking tool substrate made of Cu or a Cu alloy.

The solder film mentioned in (1) above which is formed on a masking tool substrate, particularly a masking tool substrate made of Cu or a Cu alloy, cannot fully protect the surface of the masking tool substrate when the film thickness is less than 5 $\mu$m, whereas the solder film disadvantageously requires too much time for removal when the film thickness exceeds 100 $\mu$m. Accordingly, the film thickness of the solder film formed on the substrate of a masking tool is designed to be 5–100 $\mu$m. A more preferred range of the film thickness of the solder film is 10–50 $\mu$m. Accordingly, the present invention is further characterized as:

(2) a masking tool for physical vapor deposition apparatuses for Au, which comprises a solder film having a film thickness of 5–100 $\mu$m, formed on the surface of a masking tool substrate, particularly the surface of a masking tool substrate made of Cu or a Cu alloy.

Although the solder of the solder film mentioned above can be any solder which meets the requirements specified by JIS Z 3282-86, use of solder having a melting point of 100° C. or more, more specifically soft solder having a melting point of 100–450° C., is preferred in view of the heat resistance of the solder film which is required during physical vapor deposition of Au and also in order to prevent production of an intermetallic compound between Cu in the masking tool substrate and Sn which is contained in the solder. Accordingly, the present invention is further characterized as:

(3) a masking tool for physical vapor deposition apparatuses for Au, which comprises a solder film composed of soft solder having a melting point of 100–450° C., formed on the surface of a masking tool substrate, particularly the surface of a masking tool substrate made of Cu or a Cu alloy; and (4) a masking tool for physical vapor deposition apparatuses for Au, which comprises a solder film composed of soft solder having a melting point of 100–450° C. and having a film thickness of 5–100 $\mu$m, formed on the surface of a masking tool substrate, particularly the surface of a masking tool substrate made of Cu or a Cu alloy.

The solder film according to the present invention can also be formed on the surface of a masking tool which is used for physical vapor deposition apparatuses for noble metals (Ag, Pt, Pd and Rh) other than Au, and can further be formed on the surface of, for example, the shielding ring 5 or the shutter 6 illustrated in FIG. 1, for physical vapor deposition apparatuses, to increase the number of times of recycling these various parts, without being limited to masking tools for physical vapor deposition apparatuses. Therefore, when all the parts which can be used for physical vapor deposition apparatuses to prevent adhesion of vapor deposition films are collectively referred to as "deposition-preventing parts", the present invention is further characterized as:

(5) a deposition-preventing part for physical vapor deposition apparatuses for noble metals, which comprises a solder film formed on the surface of a deposition-preventing part substrate made of a metal, particularly a deposition-preventing part substrate made of Cu or a Cu alloy.

Since the solder film which is formed on the surface of a deposition-preventing part substrate made of a metal, particularly a deposition-preventing part substrate made of Cu or a Cu alloy, is the same as the solder film which is formed on the surface of the masking tool substrate described above, the present invention is further characterized as:

(6) a deposition-preventing part for physical vapor deposition apparatuses for noble metals, which comprises a solder film having a film thickness of 5–100 μm, formed on the surface of a deposition-preventing part substrate made of a metal, particularly the surface of a deposition-preventing part substrate made of Cu or a Cu alloy;

(7) a deposition-preventing part for physical vapor deposition apparatuses for noble metals, which comprises a solder film composed of soft solder having a melting point of 100–450° C., formed on the surface of a deposition-preventing part substrate made of a metal, particularly the surface of a deposition-preventing part substrate made of Cu or a Cu alloy; and (8) a deposition-preventing part for physical vapor deposition apparatuses for noble metals, which comprises a solder film composed of soft solder having a melting point of 100–450° C. and having a film thickness of 5–100 μm, formed on the surface of a deposition-preventing part substrate made of a metal, particularly the surface of a deposition-preventing part substrate made of Cu or a Cu alloy.

Although the deposition-preventing part substrate made of a metal can be prepared of any metallic material so long as the material has excellent heat resistance, the material preferably is Cu or a Cu alloy in view of the heat conductivity and the price, and the solder film on the surface of the deposition-preventing part substrate can be formed by electroplating, electroless plating, physical vapor deposition, application of solder paste or any other process.

All that is needed to remove the metal film adhering to the surface of a deposition-preventing part provided with the solder film according to the present invention is to immerse the deposition-preventing part with the metallic film adhering thereto in a solution of a solder-removing agent, while shaking if necessary.

The deposition-preventing part provided with the solder film according to the present invention can be used as not only a deposition-preventing part for physical vapor deposition apparatuses for noble metals (Au, Ag, Pt, Pd and Rh), but also a deposition-preventing part for physical vapor deposition apparatuses for metals other than noble metals, such as Cr, Ni, Al and Cu. Accordingly, the present invention is further characterized as:

(9) a deposition-preventing part for physical vapor deposition apparatuses for metals, which comprises a solder film formed on the surface of a deposition-preventing part substrate made of a metal, particularly a deposition-preventing part substrate made of Cu or a Cu alloy:

(10) a deposition-preventing part for physical vapor deposition apparatuses for metals, which comprises a solder film having a film thickness of 5–100 μm, formed on the surface of a deposition-preventing part substrate made of a metal, particularly the surface of a deposition-preventing part substrate made of Cu or a Cu alloy;

(11) a deposition-preventing part for physical vapor deposition apparatuses for metals, which comprises a solder film composed of soft solder having a melting point of 100–450° C., formed on the surface of a deposition-preventing part substrate made of a metal, particularly the surface of a deposition-preventing part substrate made of Cu or a Cu alloy; and (12) a deposition-preventing part for physical vapor deposition apparatuses for metals, which comprises a solder film composed of soft solder having a melting point of 100–450° C. and having a film thickness of 5–100 μm, formed on the surface of a deposition-preventing part substrate made of a metal, particularly the surface of a deposition-preventing part substrate made of Cu or a Cu alloy.

Although all the deposition-preventing parts with the above-described solder films formed thereon for physical vapor deposition apparatuses produce excellent effects, when the noble metal covers the entire surface of the solder film of the deposition-preventing part, the solder-removing agent is prevented from coming into contact with the solder film, and this makes it difficult to peel the solder film from the deposition-preventing part and thus requires much time for the recovery of the noble metal in some cases even when the noble metal-adhering, deposition-preventing part is immersed in a solution of a solder-removing agent and shaken. Even in such a case, however, when a previously solder-plated Cu wire or Cu foil tape, an Al foil tape or a synthetic resin tape is attached in a peelable manner, via an adhesive, on the top surface of the solder film formed on the surface of the deposition-preventing part, and the solder-plated Cu wire or the solder-plated Cu foil tape, the Al foil tape or the synthetic resin tape is peeled off after physical vapor deposition of Au, the portion of the solder film which is in contact with the applied Cu wire, Cu foil tape, Al foil tape or synthetic resin tape, is exposed. Accordingly, when the deposition-preventing part with Au adhering thereto by physical vapor deposition, which is provided with the partially exposed solder film, is then immersed in a solution of a solder-removing agent, while shaking if necessary, the physical vapor deposition Au film formed on the surface of the solder film is more easily peeled in a short time at the same time when the solder film is removed.

Accordingly, the present invention is further characterized as:

(13) a masking tool for physical vapor deposition apparatuses for Au, which comprises one or more of a solder-plated Cu wire, a solder-plated Cu foil tape, an Al foil tape and a synthetic resin tape which are attached in a peelable manner, via an adhesive, on a solder film formed on the surface of a masking tool substrate, particularly on the surface of a masking tool substrate made of Cu or a Cu alloy.

Since it is apparently preferred that the solder film which is formed on a masking tool substrate, particularly a masking tool substrate made of Cu or a Cu alloy, be a solder film which comprises soft solder having a melting point of 100–450° C. and has a film thickness of 5–100 μm, the present invention is further characterized as:

(14) a masking tool for physical vapor deposition apparatuses for Au, which comprises one or more of a solder-plated Cu wire, a solder-plated Cu foil tape, an Al foil tape and a synthetic resin tape which are attached in a peelable manner, via an adhesive, on a solder film composed of soft solder having a melting point of 100–450° C. which is formed on the surface of a masking tool substrate, particularly of a masking tool substrate made of Cu or a Cu alloy; and (15) a masking tool for physical vapor deposition apparatuses for Au, which comprises one or more of a solder-plated Cu wire, a solder-plated Cu foil tape, an Al foil tape and a synthetic resin tape which are attached in a peelable manner, via an adhesive, on a solder film which composes soft solder having a melting point of 100–450° C. and has a film thickness of 5–100 μm, formed on the surface of a masking tool substrate, particularly of a masking tool substrate made of Cu or a Cu alloy.

The solder film according to the present invention can be formed on not only the surfaces of the above-described masking tools for physical vapor deposition apparatuses for Au, but also on the surfaces of various deposition-preventing parts, such as shielding rings or shutters, for physical vapor deposition apparatuses for noble metals (Ag, Pt, Pd and Rh) other than Au, to increase the number of times these various parts can be recycled. Therefore, the present invention is further characterized as:

(16) a deposition-preventing part for physical vapor deposition apparatuses for noble metals, which comprises one or more of a solder-plated Cu wire, a solder-plated Cu foil tape, an Al foil tape and a synthetic resin tape which are attached in a peelable manner, via an adhesive, on a solder film formed on the surface of a deposition-preventing part substrate made of a metal, particularly of a deposition-preventing part substrate made of Cu or a Cu alloy.

Since the solder film which is formed on the surface of a deposition-preventing part substrate made of a metal, particularly a deposition-preventing part substrate made of Cu or a Cu alloy, is the same as the solder film which is formed on the surface of the masking tool substrate described above, the present invention is further characterized as:

(17) a deposition-preventing part for physical vapor deposition apparatuses for noble metals, which comprises one or more of a solder-plated Cu wire, a solder-plated Cu foil tape, an Al foil tape and a synthetic resin tape which are attached in a peelable manner, via an adhesive, on a solder film having a film thickness of 5–100 μm which is formed on the surface of a deposition-preventing part substrate made of a metal, particularly of a deposition-preventing part substrate made of Cu or a Cu alloy;

(18) a deposition-preventing part for physical vapor deposition apparatuses for noble metals, which comprises one or more of a solder-plated Cu wire, a solder-plated Cu foil tape, an Al foil tape and a synthetic resin tape which are attached in a peelable manner, via an adhesive, on a solder film composed of soft solder having a melting point of 100–450° C. which is formed on the surface of a deposition-preventing part substrate made of a metal, particularly of a deposition-preventing part substrate made of Cu or a Cu alloy; and (19) a deposition-preventing part for physical vapor deposition apparatuses for noble metals, which comprises one or more of a solder-plated Cu wire, a solder-plated Cu foil tape, an Al foil tape and a synthetic resin tape which are attached in a peelable manner, via an adhesive, on a solder film which composes soft solder having a melting point of 100–450° C. and has a film thickness of 5–100 μm, formed on the surface of a deposition-preventing part substrate made of a metal, particularly of a deposition-preventing part substrate made of Cu or a Cu alloy.

The deposition-preventing part provided with the solder film according to the present invention can be used as not only a deposition-preventing part for physical vapor deposition apparatuses for noble metals (Au, Ag, Pt, Pd and Rh), but also a deposition-preventing part for physical vapor deposition apparatuses for metals other than noble metals, such as Cr, Ki, Al and Cu. Accordingly, the present invention is further characterized as:

(20) a deposition-preventing part for physical vapor deposition apparatuses for metals, which comprises one or more of a solder-plated Cu wire, a solder-plated Cu foil tape, an Al foil tape and a synthetic resin tape which are attached in a peelable manner, via an adhesive, on a solder film formed on the surface of a deposition-preventing part substrate made of a metal, particularly of a deposition-preventing part substrate made of Cu or a Cu alloy;

(21) a deposition-preventing part for physical vapor deposition apparatuses for metals, which comprises one or more of a solder-plated Cu wire, a solder-plated Cu foil tape, an Al foil tape and a synthetic resin tape which are attached in a peelable manner, via an adhesive, on a solder film having a film thickness of 5–100 μm which is formed on the surface of a deposition-preventing part substrate made of a metal, particularly of a deposition-preventing part substrate made of Cu or a Cu alloy;

(22) a deposition-preventing part for physical vapor deposition apparatuses for metals, which comprises one or more of a solder-plated Cu wire, a solder-plated Cu foil tape, an Al foil tape and a synthetic resin tape which are attached in a peelable manner, via an adhesive, on a solder film composed of soft solder having a melting point of 100–450° C. which is formed on the surface of a deposition-preventing part substrate made of a metal, particularly of a deposition-preventing part substrate made of Cu or a Cu alloy; and (23) a deposition-preventing part for physical vapor deposition apparatuses for metals, which comprises one or more of a solder-plated Cu wire, a solder-plated Cu foil tape, an Al foil tape and a synthetic resin tape which are attached in a peelable manner, via an adhesive, on a solder film which composes soft solder having a melting point of 100–450° C. and has a film thickness of 5–100 μm, formed on the surface of a deposition-preventing part substrate made of a metal, particularly of a deposition-preventing part substrate made of Cu or a Cu alloy.

In cases where the surface of the solder film formed on the deposition-preventing part substrate made of a metal is too smooth as defined by a measurement smaller than 0.01 μm in terms of the arithmetic mean roughness defined by JIS B 0601 (hereunder referred to as "Ra"), the metal deposited on the deposition-preventing part by vapor deposition peels off to cause formation of particles during the process of vapor deposition, whereas the surface of the solder film formed on the deposition-preventing part substrate made of a metal is too rough as defined by a measurement greater than 1 μm when expressed as Ra, the adhesive used to attach the metal tape to the surface of the solder film remains in hollows of the solder film when it is attempted to peel the metal tape from the solder film, and eventually the remaining adhesive disadvantageously prevents chemical dissolution of the solder film when the deposition-preventing part is immersed in a solution of a solder-removing agent after physical vapor deposition. Therefore, the surface roughness of the solder film formed on the deposition-preventing part substrate made of a metal is preferred to be within the range of 0.01–1 μm when expressed as Ra.

Accordingly, the surface roughness of the solder films formed on the deposition-preventing parts for physical vapor apparatuses for metals which are described in (1) through (23) above are characterized as being within the range of 0.01–1 μm (preferably 0.1–0.8 μm) when expressed as Ra.

EXAMPLES

Having generally described this invention, a further understanding can be obtained by reference to certain specific examples which are provided herein for purposes of illustration only and are not intended to be limiting unless otherwise specified.

Example 1

A lathed (3.2-S) masking tool substrate made of Cu was prepared for the preparation of CD-ROMS. The surface roughness of the masking tool substrate made of Cu for preparing CD-ROMs was measured to be 0.58 μm when expressed as Ra. In addition, there was also prepared a plating solution composed of:

57 g/l of lead methanesulfonate;
3 g/l of tin methanesulfonate;
0.72 N free methanesulfonic acid; and
33 g/l of a commercially available lubricating agent.

The plating solution was used to prepare Masking tool 1 according to the present invention by forming a film of Pb-5% Sn solder (m.p.: 310° C.) having a thickness of 10 μm and a surface roughness Ra of 0.75 μm, on the surface of the masking tool substrate made of Cu, under the following conditions:

temperature of the plating solution: 20° C.,
stirring condition: 1,000 r.p.m. (by a magnetic stirrer),
cathodic current-density: 5 A/dm², and
plating time: 5 minutes.

Masking tool 1 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 1 according to the present invention, the masking tool was immersed in a 5 liters of a solder-removing solution (a 50% by volume solution of lactic acid in water) (solution temperature: 40° C.) under application of ultrasonic vibration.

As a result, the solder film on the surface of the masking tool substrate dissolved in the solder-removing solution, and the adhering physical vapor deposition Au film completely peeled off in the solder-removing solution in 27 minutes. The physical vapor deposition Au film which peeled off into the solder-removing solution was easily recovered by filtering off the solder-removing solution. The foregoing operation for recovery of the Au and regeneration of the masking tool substrate was repeated. The number of times the substrate of Masking tool 1 could be recycled without impairing the dimensional precision thereof and causing deformation thereof (hereunder referred to as "the number of recycling times") was counted to be 95.

Example 2

The masking tool substrate made of Cu for the preparation of CD-ROMs which was prepared in Example 1 was immersed in a plating solution composed of:

14.8 g/l of lead methanesulfonate;
25.2 g/l of tin methanesulfonate;
0.72 N free methanesulfonic acid; and
33 g/l of a commercially available lubricating agent, and
Masking tool 2 according to the present invention was prepared by forming a film of Pb-63% Sn solder (m.p.: 183° C.) having a thickness of 20 μm and a surface roughness Ra of 0.75 μm, on the surface of the masking tool substrate made of Cu, under the following conditions:
temperature of the plating solution: 20° C.;
stirring condition: 1,000 r.p.m. (by a magnetic stirrer);
cathodic current-density: 5 A/dm²; and
plating time: 10 minutes.

Masking tool 2 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 2 according to the present invention, the masking tool was used in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 20 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times was counted to be 62.

Example 3

The masking tool substrate made of Cu for the preparation of CD-ROMs which was prepared in Example 1 was subjected to abrasive processing with abrasive paper (#1,500) to prepare a masking tool substrate having a surface roughness Ra of 0.07 μm. A 50-μm-thick film of Pb5% In-5% Ag solder (m.p.: 290° C.) was formed on the surface of the masking tool substrate by vapor deposition under the conventional conditions to prepare Masking tool 3 according to the present invention. The surface roughness Ra of the solder film of Masking tool 3 according to the present invention was 0.12 μm.

Masking tool 3 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 3 according to the present invention, the masking tool was used in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 13 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times was counted to be 73.

Example 4

The masking tool substrate made of Cu for the preparation of CD-ROMs which was subjected to abrasive processing with abrasive paper (#1,500) in Example 3, was further subjected to buffing with 1-μm-φ diamond abrasive grains to prepare a masking tool substrate having a surface roughness Ra of 0.02 μm. A 90-μm-thick film of Sn-5% Ag solder (m.p.: 221° C.) was formed on the surface of the masking tool substrate by vapor deposition under the conventional conditions to prepare Masking tool 4 according to the present invention. The surface roughness Ra of the solder film of Masking tool 4 according to the present invention was 0.10 μm.

Masking tool 4 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 4 according to the present invention, the masking tool was used in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 6 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times was counted to be 53.

Example 5

The masking tool substrate made of Cu for the preparation of CD-ROMs which was prepared in Example 3 and has a surface roughness Ra of 0.07 μm, was immersed in a plating solution composed of:

60 g/l of lead methanesulfonate;

0.72 N free methanesulfonic acid; and 33 g/l of a commercially available lubricating agent, and Masking tool 5 according to the present invention was prepared by forming a film of pure Pb solder (m.p.: 328° C.) having a thickness of 100 μm and a surface roughness Ra of 0.45 μm, on the surface of the masking tool substrate made of Cu, under the following conditions:

temperature of the plating solution: 20° C.;

stirring condition: 1,000 r.p.m. (by a magnetic stirrer);

cathodic current-density: 5 A/dm$^2$; and plating time: 50 minutes.

Masking tool 5 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 5 according to the present invention, the masking tool was used in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 23 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times was counted to be 84.

Example 6

The masking tool substrate made of Cu for the preparation of CD-ROMs which was prepared in Example 3 and has a surface roughness Ra of 0.07 μm, was immersed in a plating solution composed of:

60 g/l of tin methanesulfonate;

0.72 N free methanesulfonic acid; and 33 g/l of a commercially available lubricating agent, and Masking tool 6 according to the present invention was prepared by forming a film of pure Sn solder (m.p.: 232° C.) having a thickness of 5 μm and a surface roughness Ra of 0.25 μm, on the surface of the masking tool substrate made of Cu, under the following conditions:

temperature of the plating solution: 20° C.;

stirring condition: 1,000 r.p.m. (by a magnetic stirrer);

cathodic current-density: 5 A/dm$^2$; and plating time: 2.5 minutes.

Masking tool 6 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 6 according to the present invention, the masking tool was immersed in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 16 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times was counted to be 46.

Example 7

Figure 3:
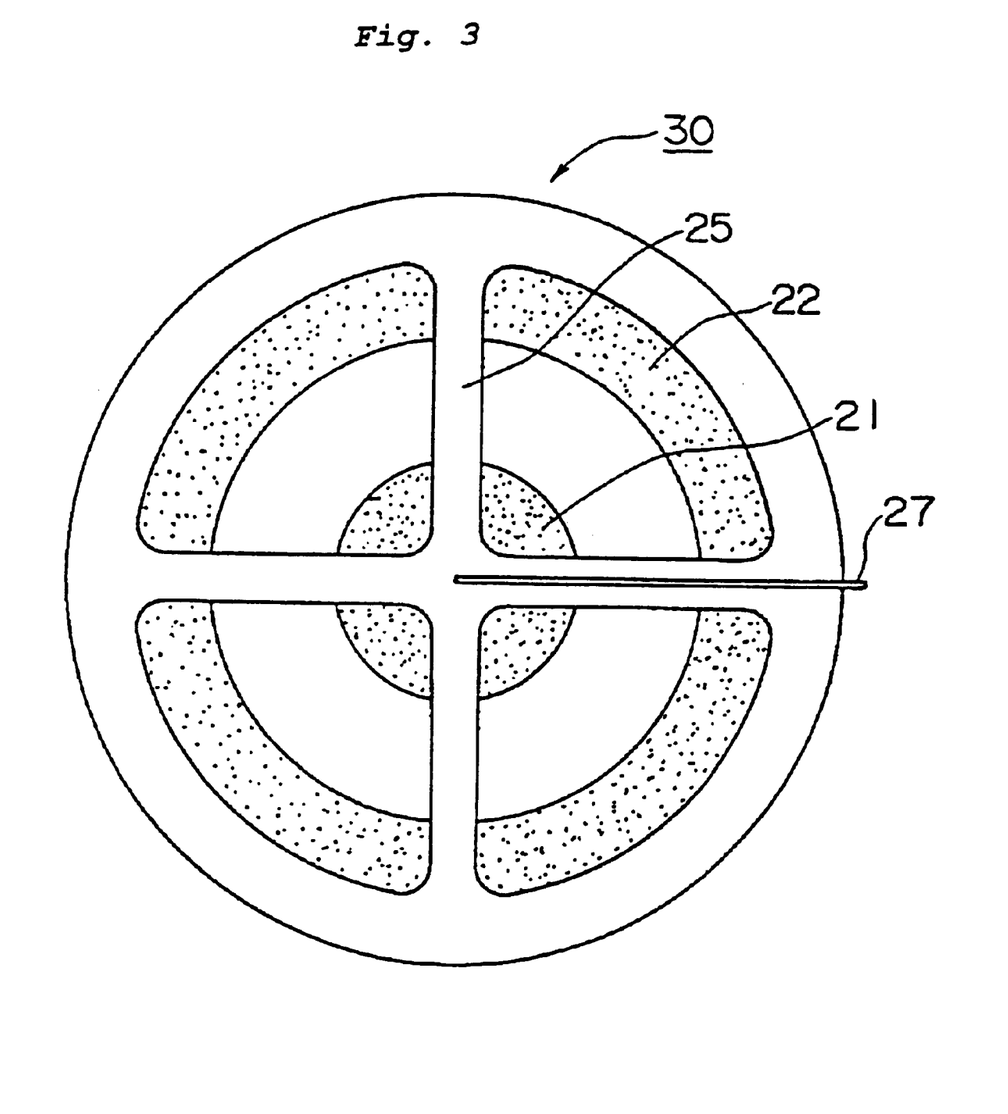
FIG. 3 is a plan view of a masking tool.

As illustrated in the plan view in FIG. 3, a Cu wire 27 having a 10-μm-thick film plated with Pb-5% Sn solder (m.p.: 310° C.) , was bonded to a supporting arm 25 with a trace quantity of a synthetic rubber-based-adhesive in a peelable manner, on the surface of Masking tool 1 according to the present invention which was prepared in Example 1 by forming a film of Pb-5% Sn solder (m.p.: 310° C.) having a thickness of 10 μm and a surface roughness Ra of 0.75 μm, on the surface of a masking tool substrate made of Cu, to prepare Masking tool 7 according to the present invention.

Masking tool 7 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 7 according to the present invention, the solder-plated Cu wire 27 which was bonded onto the solder film of the masking tool was removed to partially expose the solder film formed on the surface of the masking tool substrate, and the masking tool was immersed in a 5 liters of a solder-removing solution (a 50% by volume solution of lactic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 17 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of Masking tool 7 according to the present invention was counted to be 105.

Example 8

Figure 4:
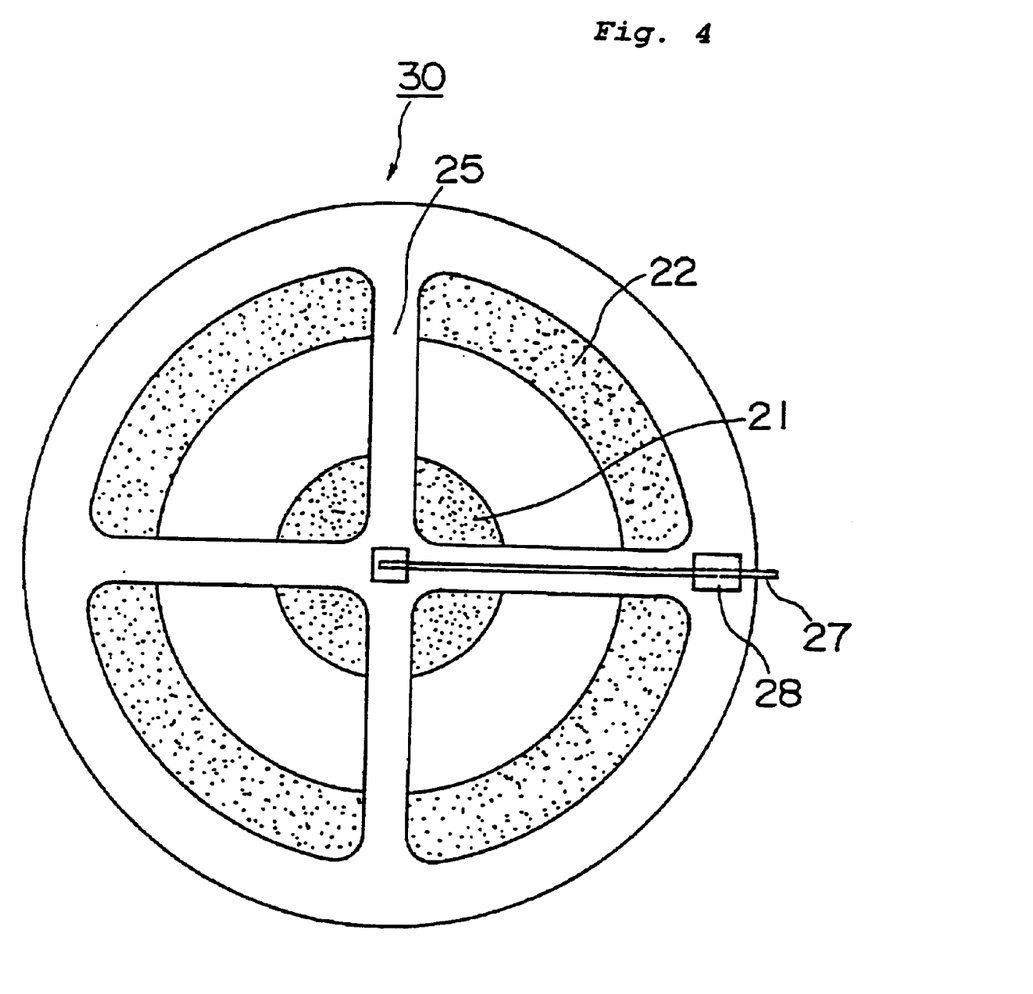
FIG. 4 is a plan view of a masking tool.

As illustrated in the plan view in FIG. 4, a Cu wire 27 having a 10-μm-thick film plated with Pb-63% Sn solder (m.p.: 183° C.), was bonded and fixed, in a peelable manner, to a supporting arm 25 using an Al foil tape 28 with an adhesive applied to the underside thereof, on the surface of Masking tool 2 according to the present invention which was prepared in Example 2 by forming a film of Pb-63% Sn solder (m.p.: 183° C.) having a thickness of 20 μm and a surface roughness Ra of 0.75 μm, on the surface of a masking tool substrate made of Cu, to prepare Masking tool 8 according to the present invention.

Masking tool 8 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 8 according to the present invention, the solder-plated Cu wire 27 which was bonded and fixed onto the solder film of the masking tool and the Al foil tape 28 were removed to partially expose the solder film formed on the surface of the masking tool substrate, and the masking tool was immersed in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 14 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of Masking tool 8 according to the present invention was counted to be 72.

Example 9

Figure 5:
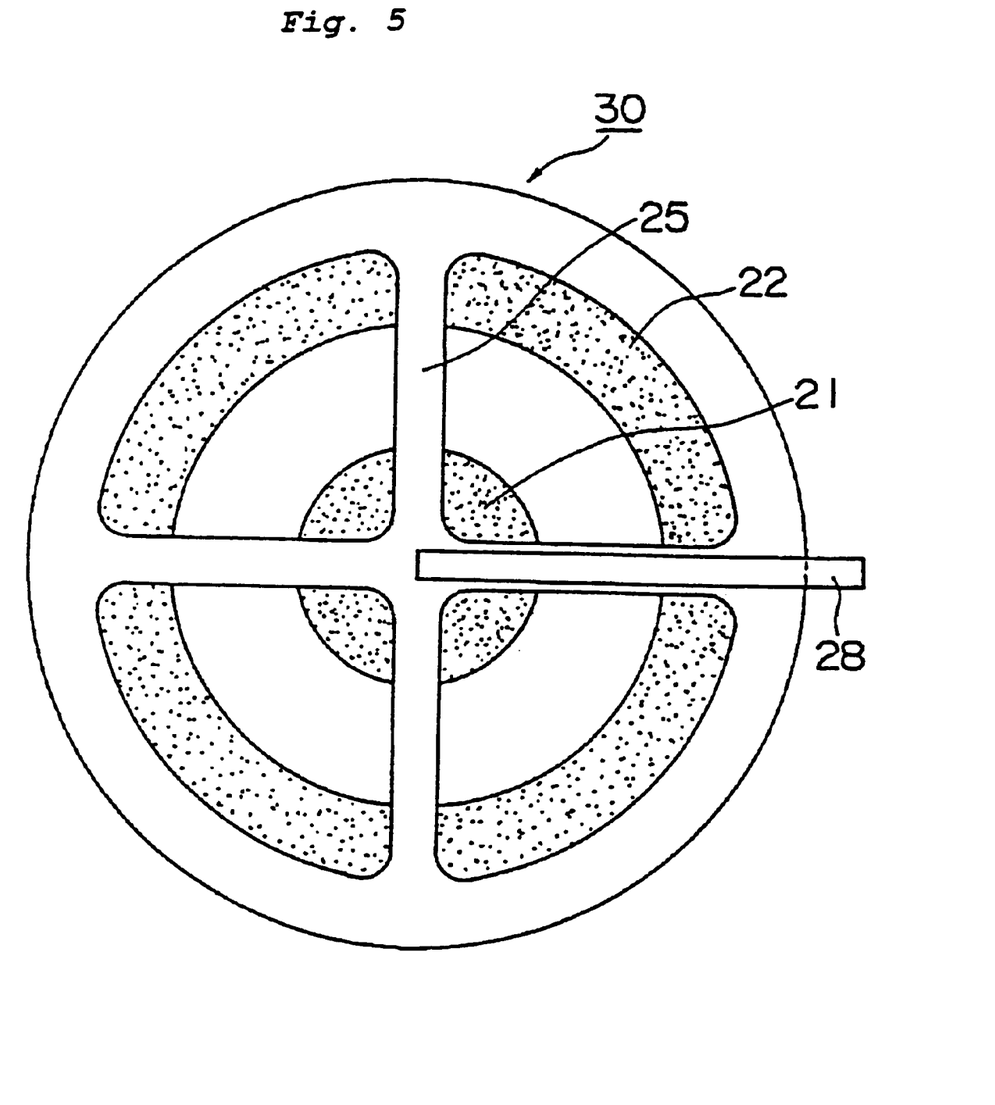
FIG. 5 is a plan view of a masking tool.

As illustrated in the plan view in FIG. 5, an Al foil tape 28 with an adhesive applied to the underside thereof was bonded, in a peelable manner, to the surface of Masking tool 3 according to the present invention which was prepared in Example 3 by forming a film of Pb-5% In-5% Ag solder (m.p.: 290° C.) having a thickness of 50 μm and a surface roughness Ra of 0.12 μm, on the surface of a masking tool substrate made of Cu by vapor deposition under the conventional conditions, to prepare Masking tool 9 according to the present invention.

Masking tool 9 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 9 according to the present invention, the Al foil tape 28 which was bonded onto the solder film of the masking tool was removed to partially expose the solder film formed on the surface of the masking tool substrate, and the masking tool was immersed in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 7 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of Masking tool 9 according to the present invention was counted to be 85.

Example 10

Figure 6:
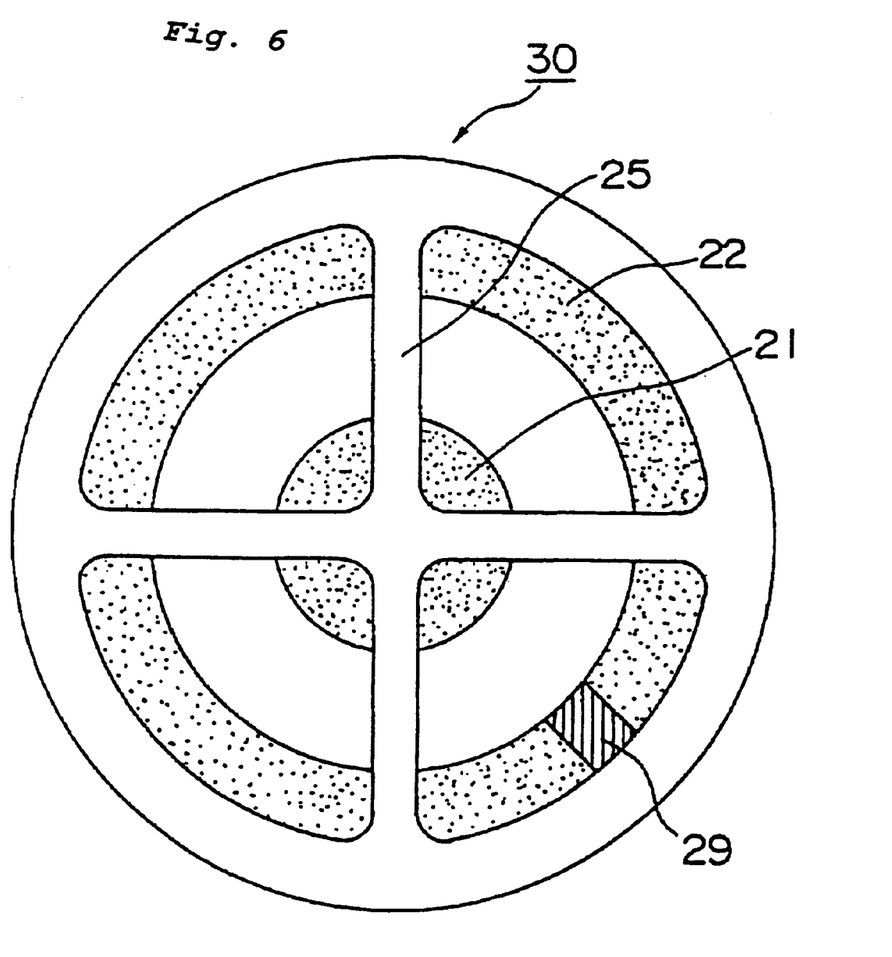
FIG. 6 is a plan view of a masking tool.

As illustrated in the plan view of the masking tool in FIG. 6, a vinyl tape 29 with an adhesive applied to the underside thereof was bonded, in a peelable manner, onto the solder film of a peripheral masking shield 22 of Masking tool 4 according to the present invention which was prepared in Example 4 by forming a vapor deposition film of Sn-5% Ag solder (m.p.: 221° C.) having a thickness of 90 μm and a surface roughness Ra of 0.10 μm, on the surface of a masking tool substrate made of Cu, to prepare Masking tool 10 according to the present invention.

Masking tool 10 according to the present invention was used in order to form a physical vapor deposition Au film on the surface of a CD-ROM substrate to thereby prepare a CD-ROM. Upon adhesion of a 1-mm-thick physical vapor deposition Au film onto the surface of Masking tool 10 according to the present invention, the vinyl tape 29 which was bonded onto the solder film of the masking tool was removed to partially expose the solder film formed on the surface of the masking tool substrate, and the masking tool was immersed in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 5 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of Masking tool 10 according to the present invention was counted to be 63.

Example 11

By using a vinyl tape with an adhesive applied to the underside thereof, a Cu foil tape with a 10-μm-thick, pure Pb-plated film formed thereon was bonded, in a peelable manner, onto the solder film of the supporting arm of the masking tool according to the present invention which was prepared in Example 5 by forming a film of pure Pb solder (m.p.: 328° C.) having a thickness of 100 μm and a surface roughness Ra of 0.45 μm, on the surface of a masking tool substrate made of Cu, to prepare Masking tool 11 according to the present invention.

Masking tool 11 according to the present invention was used in order to form a physical vapor deposition Au film on the surface of a CD-ROM substrate to thereby prepare a CD-ROM record medium. Upon adhesion of a 1-mm-thick physical vapor deposition Au film onto the surface of Masking tool 11 according to the present invention, the Cu foil tape and the vinyl tape which were bonded onto the solder film of the masking tool were removed to partially expose the solder film formed on the surface of the masking tool substrate, and the masking tool was immersed in a 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film completely peeled off in the solder-removing solution in 20 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of the masking tool was counted to be 82.

Example 12

An Al foil tape and a vinyl tape each with an adhesive applied to the underside thereof were bonded, in a peelable manner, onto the solder film of each of the supporting arm and the center masking shield of the solder film-coated masking tool which was prepared in Example 6 by forming a film of pure Sn solder (m.p.: 232° C.) having a thickness of 5 $\mu$m and a surface roughness Ra of 0.25 $\mu$m, on the surface of a masking tool substrate made of Cu, to prepare Masking tool 12 according to the present invention.

Masking tool 12 according to the present invention was used in order to form a physical vapor deposition Au film on the surface of a CD-ROM substrate to thereby prepare a CD-ROM. Upon adhesion of a 1-mm-thick physical vapor deposition Au film onto the surface of masking tool 12 according to the present invention, the Al foil tape and the vinyl tape which were bonded onto the solder film of Masking tool 12 according to the present invention were removed to partially expose the solder film formed on the surface of the masking tool substrate, and the masking tool was immersed in 5 liters of a solder-removing solution (a 50% by volume solution of acetic acid in water) (solution temperature: 40° C.) under application of ultrasonic vibration.

As a result, the solder film on the surface of the masking tool substrate dissolved in the solder-removing solution, the adhering physical vapor deposition Au film peeled off in the solder-removing solution in 14 minutes, and the physical vapor deposition Au film which peeled off into the solder-removing solution was easily recovered by filtering off the solder-removing solution. The foregoing operation for recovery of the Au and regeneration of the masking tool substrate was repeated, and the number of recycling times of the masking tool was counted to be 85.

Comparative Example 1

A 1-$\mu$m-thick Rh film was formed, under conventional electroplating conditions, on the surface of the masking tool substrate made of Cu for the preparation of CD-ROMs which was prepared in Example 1, to prepare Masking tool 1 according to the prior art. Masking tool 1 according to the prior art was used in order to form a physical vapor deposition Au film on the surface of a CD-ROM substrate to thereby prepare a CD-ROM. Upon adhesion of a 1-mm-thick physical vapor deposition Au film onto the surface of Masking tool 1 according to the prior art, the masking tool was immersed in a gold-removing solution with a commercially available gold-removing agent dissolved therein (solution temperature: 30° C.) for 5 hours to recover the Au. The recovery of the Au and regeneration of the masking tool was repeated, and the number of recycling times of Masking tool 1 according to the prior art was counted to be 8.

Comparative Example 2

A 0.5-$\mu$m-thick Pt film was formed, under conventional electroplating conditions, on the surface of the masking tool substrate made of Cu for the preparation of CD-ROMs which was prepared in Example 1, to prepare Masking tool 2 according to the prior art. Masking tool 2 according to the prior art was used in order to form a physical vapor deposition Au film on the surface of a CD-ROM substrate to thereby prepare a CD-ROM. Upon adhesion of a 1-mm-thick physical vapor deposition Au film onto the surface of Masking tool 2 according to the prior art, the masking tool was immersed in a gold-removing solution with a commercially available gold-removing agent dissolved therein (solution temperature: 30° C.) for 5 hours to recover the Au. The recovery of the Au and regeneration of the masking tool was repeated, and the number of recycling times of Masking tool 2 according to the prior art was counted to be 9.

The results of Examples 1–12 and Comparative Examples 1–2 show that:

(a) Masking tools 1–12 according to the present invention which have solder films formed thereon all have greatly increased numbers of recycling times as compared with Masking tools 1–2 according to the prior art which have films of platinum-group metals formed thereon; and (b) Although 5 hours are required for removal of a 1-mm-thick physical vapor deposition Au film in the case of Masking tools according to the prior art which have films of platinum-group metals formed thereon, the peeling can be completed in a shorter time than 60 minutes for Masking tools 1–12 according to the present invention, and this short time required for the peeling apparently increased the efficiency.

Although the foregoing description is focused on comparison in peeling of physical vapor deposition Au films adhering to masking tools for physical vapor deposition apparatuses from the masking tools between Examples and Comparative Examples, the present invention is not limited to deposition-preventing parts for physical vapor deposition apparatuses for Au, and can also be applied to deposition-preventing parts for physical vapor deposition apparatuses for noble metals (Ag, Pt, Pd and Rh) other than Au, and further such metals as Cr, Ni, Al and Cu.

As described above, the deposition-preventing parts according to the present invention for physical vapor deposition apparatuses which have solder films formed thereon, particularly the masking tools, have greatly increased numbers of recycling times, and allow removal of the adhering physical vapor deposition films in a short time, and this greatly contributes to lower costs.

The disclosure of Japan priority applications HEI 8-27584, filed Feb. 15, 1996; HEI 8-68123, filed Mar. 25, 1996; and HEI 8-180739, filed Jul. 10, 1996, is hereby incorporated by reference.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States:

1. A deposition-preventing part for physical vapor deposition apparatuses, comprising:

a deposition-preventing part substrate and a solder film formed on a surface thereof; and a solder-plated metal wire or a solder-plated metal foil tape bonded onto the solder film in a peelable manner via an adhesive.

2. A deposition-preventing part for physical vapor deposition apparatuses, comprising:

a deposition-preventing part substrate and a solder film formed on a surface thereof; and an Al foil tape bonded onto the solder film in a peelable manner via an adhesive.

3. A deposition-preventing part for physical vapor deposition apparatuses, comprising:

a deposition-preventing part substrate and a solder film formed on a surface thereof; and a solder-plated metal wire or a solder-plated metal foil tape fixed onto the solder film in a releasable manner, using an Al foil tape with an adhesive applied to one side thereof.

4. A deposition-preventing part for physical vapor deposition apparatuses, comprising:

a deposition-preventing part substrate and a solder film formed on a surface thereof; and a synthetic resin tape bonded onto the solder film in a peelable manner via an adhesive.

5. A deposition-preventing part for physical vapor deposition apparatuses, comprising:

a deposition-preventing part substrate and a solder film formed on a surface thereof; and a solder-plated metal wire or a solder-plated metal foil tape fixed onto the solder film in a releasable manner, using a synthetic resin tape with an adhesive applied to one side thereof.

6. A deposition-preventing part for physical vapor deposition apparatuses as claimed in claim 1, wherein the solder film comprises soft solder with a melting point of 100–450° C. and has a film thickness of 5–100 $\mu$m.

7. A deposition-preventing part for physical vapor deposition apparatuses as claimed in claim 2, wherein the solder film comprises soft solder with a melting point of 100–450° C. and has a film thickness of 5–100 $\mu$m.

8. A deposition-preventing part for physical vapor deposition apparatuses as claimed in claim 3, wherein the solder film comprises soft solder with a melting point of 100–450° C. and has a film thickness of 5–100 $\mu$m.

9. A deposition-preventing part for physical vapor deposition apparatuses as claimed in claim 4, wherein the solder film comprises soft solder with a melting point of 100–450° C. and has a film thickness of 5–100 $\mu$m.

10. A deposition-preventing part for physical vapor deposition apparatuses as claimed in claim 5, wherein the solder film comprises soft solder with a melting point of 100–450° C. and has a film thickness of 5–100 $\mu$m.

11. A deposition-preventing part for physical vapor deposition apparatuses as claimed in claim 1, wherein the surface roughness of the solder film is within the range of 0.01–1 $\mu$m.

12. A deposition-preventing part for physical vapor deposition apparatuses as claimed in claim 2, wherein the surface roughness of the solder film is within the range of 0.01–1 $\mu$m.

13. A deposition-preventing part for physical vapor deposition apparatuses as claimed in claim 3, wherein the surface roughness of the solder film is within the range of 0.01–1 $\mu$m.

14. A deposition-preventing part for physical vapor deposition apparatuses as claimed in claim 4, wherein the surface roughness of the solder film is within the range of 0.01–1 $\mu$m.

15. A deposition-preventing part for physical vapor deposition apparatuses as claimed in claim 5, wherein the surface roughness of the solder film is within the range of 0.01–1 $\mu$m.

16. A deposition-preventing part for physical vapor deposition apparatuses as claimed in claim 1, wherein said surface of said substrate is composed of copper or a copper alloy.

17. A deposition-preventing part for physical vapor deposition apparatuses as claimed in claim 2, wherein said surface of said substrate is composed of copper or a copper alloy.

18. A deposition-preventing part for physical vapor deposition apparatuses as claimed in claim 3, wherein said surface of said substrate is composed of copper or a copper alloy.

19. A deposition-preventing part for physical vapor deposition apparatuses as claimed in claim 4, wherein said surface of said substrate is composed of copper or a copper alloy.

20. A deposition-preventing part for physical vapor deposition apparatuses as claimed in claim 5, wherein said surface of said substrate is composed of copper or a copper alloy.

21. A deposition-preventing part for physical vapor deposition apparatuses as claimed in claim 1, wherein said part is coated with a removable coating comprising a noble metal.

22. A deposition-preventing part for physical vapor deposition apparatuses as claimed in claim 2, wherein said part is coated with a removable coating comprising a noble metal.

23. A deposition-preventing part for physical vapor deposition apparatuses as claimed in claim 3, wherein said part is coated with a removable coating comprising a noble metal.

24. A deposition-preventing part for physical vapor deposition apparatuses as claimed in claim 4, wherein said part is coated with a removable coating comprising a noble metal.

25. A deposition-preventing part for physical vapor deposition apparatuses as claimed in claim 5, wherein said part is coated with a removable coating comprising a noble metal.

26. A deposition-preventing part for physical vapor deposition apparatuses as claimed in claim 1, wherein the noble metal is Au.

27. A deposition-preventing part for physical vapor deposition apparatuses as claimed in claim 21, wherein the noble metal is Au.

28. A deposition-preventing part for physical vapor deposition apparatuses as claimed in claim 22, wherein the noble metal is Au.

29. A deposition-preventing part for physical vapor deposition apparatuses as claimed in claim 23, wherein the noble metal is Au.

30. A deposition-preventing part for physical vapor deposition apparatuses as claimed in claim 24, wherein the noble metal is Au.

31. A deposition-preventing part for physical vapor deposition apparatuses as claimed in claim 25, wherein the noble metal is Au.

32. A deposition-preventing part for physical vapor deposition apparatuses as claimed in claim 1, which is a masking tool.

33. A deposition-preventing part for physical vapor deposition apparatuses as claimed in claim 2, which is a masking tool.

34. A deposition-preventing part for physical vapor deposition apparatuses as claimed in claim 3, which is a masking tool.

35. A deposition-preventing part for physical vapor deposition apparatuses as claimed in claim 4, which is a masking tool.

36. A deposition-preventing part for physical vapor deposition apparatuses as claimed in claim 5, which is a masking tool.

* * * * *